(12) United States Patent
Deng et al.

(10) Patent No.: US 7,556,505 B2
(45) Date of Patent: Jul. 7, 2009

(54) SOCKET CONNECTOR

(75) Inventors: WenFeng Deng, Jiangsu (CN); WanLin Zhang, Shanghai (CN)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 11/899,088

(22) Filed: Sep. 4, 2007

(65) Prior Publication Data

US 2008/0070447 A1 Mar. 20, 2008

(30) Foreign Application Priority Data

Sep. 4, 2006 (CN) .................... 2006 2 0139506

(51) Int. Cl.
*H01R 12/00* (2006.01)

(52) U.S. Cl. .................................. 439/70

(58) Field of Classification Search ............ 439/70, 439/78, 83

See application file for complete search history.

(56) References Cited

U.S. PATENT DOCUMENTS

| | | | | |
|---|---|---|---|---|
| 5,342,214 A * | 8/1994 | Hsu | .......... | 439/342 |
| 5,489,218 A * | 2/1996 | McHugh | .......... | 439/342 |
| 6,056,576 A * | 5/2000 | Szu | .......... | 439/342 |
| 6,099,321 A * | 8/2000 | McHugh et al. | .......... | 439/342 |
| 6,099,326 A * | 8/2000 | Lin | .......... | 439/83 |
| 6,155,845 A * | 12/2000 | Lin et al. | .......... | 439/83 |
| 6,328,574 B1 * | 12/2001 | Howell et al. | .......... | 439/70 |
| 6,390,827 B1 * | 5/2002 | Howell et al. | .......... | 439/70 |
| 6,450,824 B1 * | 9/2002 | Lemke et al. | .......... | 439/342 |
| 6,450,826 B1 * | 9/2002 | Howell et al. | .......... | 439/342 |
| 6,702,594 B2 * | 3/2004 | Lee et al. | .......... | 439/83 |
| 7,052,289 B1 * | 5/2006 | Hao | .......... | 439/83 |
| 7,097,463 B2 * | 8/2006 | Hsiao et al. | .......... | 439/70 |
| 7,134,882 B2 * | 11/2006 | Iida et al. | .......... | 439/74 |
| 2002/0031922 A1 * | 3/2002 | Hirata et al. | .......... | 439/70 |
| 2003/0013330 A1 * | 1/2003 | Takeuchi | .......... | 439/83 |
| 2003/0092304 A1 * | 5/2003 | Whyne et al. | .......... | 439/342 |
| 2004/0067665 A1 * | 4/2004 | Nakano | .......... | 439/70 |
| 2005/0124189 A1 * | 6/2005 | Johnescu et al. | .......... | 439/86 |
| 2006/0148283 A1 * | 7/2006 | Minich et al. | .......... | 439/70 |

* cited by examiner

*Primary Examiner*—Tulsidas C Patel
*Assistant Examiner*—Vladimir Imas

(57) ABSTRACT

A socket connector comprises an insulation body and a plurality of conductive terminals. A plurality of terminal receptacle grooves go through the insulation body from its upper surface to its lower surface. At least a first limit portion and a second limit portion are provided on each of the terminal receptacle grooves. Each of the conductive terminals is received in the corresponding terminal receptacle groove, and comprises a soldering portion, a base portion connected to a side of the soldering portion, an elastic arm connected to another side of the base portion and a contact portion connected to the elastic arm. In one embodiment, first wedge portions respectively extend and bend from an edge of the soldering portion opposite the base portion and another two edges. The first limit portion is positioned above the first wedge portion and limits it to moving upwards, and the second limit portion is positioned under the second wedge portion and limits it to moving downwards. Therefore, the conductive terminals are firmly fixed in the terminal receptacle grooves. It is not necessary to apply great force to the terminal receptacle grooves for the insertion of the conductive terminals, so deformation of the insulation body does not occur. Consequently, such an improvement can ensure the electrical connection stability and working life of the socket connector.

17 Claims, 14 Drawing Sheets

SOCKET CONNECTOR

This application claims priority to Chinese Application No. 200620139506.1, filed Sep. 4, 2006.

FIELD OF THE INVENTION

The present invention relates to a socket connector, and more particularly to a socket connector for electrically connecting a chip and a circuit board.

BACKGROUND OF THE INVENTION

The conventional socket connector for connecting to a chip, such as a CPU (Central Processing Unit) socket connector employed by a computer, has terminals retained in an insulation body through destructive interference between them. China Patent Nos. 02254847 and 200420055027 both disclose such a socket connector.

As shown in FIG. 1, China Patent No. 02254847 discloses a terminal 7 of a socket connector. The terminal 7 comprises a soldering portion 70, a retaining portion 71 extending from the soldering portion 70, a cantilever 72 and a contact portion 73 extending from the cantilever 72. Several protrusions 710 are provided on the retaining portion 71 so that the distance between two protrusions 710 disposed on two opposite sides is larger than the distance between the sidewalls of a receptacle groove (not shown) receiving the terminal 7. Therefore, each of the protrusions 710 is lodged in the inner walls of the receptacle groove in order to have destructive interference with each other so that the insulation body receives the terminals 7, after the terminals 7 and the insulation body are assembled.

However, such a conventional socket connector is designed for a chip; hence, the amount of the terminal receptacle grooves is very large. Therefore, stress concentration occurs in the insulation body due to the destructive interference between the terminals and the insulation body. Such stress concentration results in extreme deformation of the insulation body, and the soldering quality is affected after the socket connector is mounted onto the circuit board. Consequently, the performance and working life of the socket connector are reduced. In view of the above, the conventional socket connector needs to be improved.

SUMMARY OF THE INVENTION

The present invention provides a socket connector whose terminals are correspondingly and stably received by the terminal receptacle grooves. Thus, the deformation of the insulation body does not occur.

The present invention provides a socket connector comprising an insulation body and a plurality of conductive terminals. A plurality of terminal receptacle grooves go through the insulation body from its upper surface to its lower surface. At least a first limit portion and a second limit portion are provided on each of the terminal receptacle grooves. Each of the conductive terminals is received in a corresponding terminal receptacle groove, and comprises a soldering portion, a base portion connected to a side of the soldering portion, an elastic arm connected to another side of the base portion and a contact portion connected to the elastic arm. Each of the terminals further comprises at least a first wedge portion connected to the soldering portion and at least a second wedge connected to the base. The first limit portion is positioned above the first wedge portion and limits it to moving upwards, and the second limit portion is positioned under the second wedge portion and limits it to moving downwards.

In one embodiment, the soldering portion extends from an edge of the base portion and has a 90-degree turn. The first wedge portion extends from the soldering portion and an obtuse angle exists between them. In another embodiment, first wedge portions respectively extend and bend from an edge of the soldering portion opposite the base portion and another two edges. The first limit portion is provided on a limit stair of a sidewall of the terminal receptacle groove. A chamfer is formed on the lower edge of the second wedge portion and adjacent to the second limit portion. There is a gap existing between the lower edge of the second wedge portion and the upper edge of the second limit portion. Each of the terminal receptacle grooves has a first sidewall and a second sidewall opposite each other. Each of a third sidewall and a fourth sidewall connects the first sidewall and the second sidewall. The first limit portion extends upwards from the third sidewall, and the second limit portions respectively and oppositely extend between the first sidewall and the fourth sidewall and between the second sidewall and the fourth sidewall. In another embodiment, the limit portion extends from the first sidewall and the second sidewall. Each of the terminal receptacle grooves has retaining grooves respectively disposed between the first sidewall and the fourth sidewall and between the second sidewall and the fourth sidewall. The second limit portions are the bottoms of the second limit portions. Two edges of the base portion of each conductive terminal are received in a corresponding retaining groove.

Compared with the conventional socket connector, the conductive terminal of the socket connector of the present invention further has the first wedge portion extending from the soldering portion and the second wedge portion extending from the base portion. The first limit portion is positioned above the first wedge portion and limits it to moving upwards, and the second limit portion is positioned under the second wedge portion and limits it to moving downwards. Therefore, the conductive terminals are firmly fixed in the terminal receptacle grooves. It is not necessary to apply great force to the terminal receptacle grooves for the insertion of the conductive terminals, so the deformation of the insulation body does not occur. Consequently, such an improvement can ensure the electrical connection stability and working life of the socket connector.

BRIEF DESCRIPTION OF THE DRAWINGS

The organization and manner of the structure and operation of the invention, together with further objects and advantages thereof, may best be understood by reference to the following description taken in connection with the accompanying drawings wherein like reference numerals identify like elements in which.

DETAILED DESCRIPTION OF THE DISCLOSED EMBODIMENTS

Figure 1:
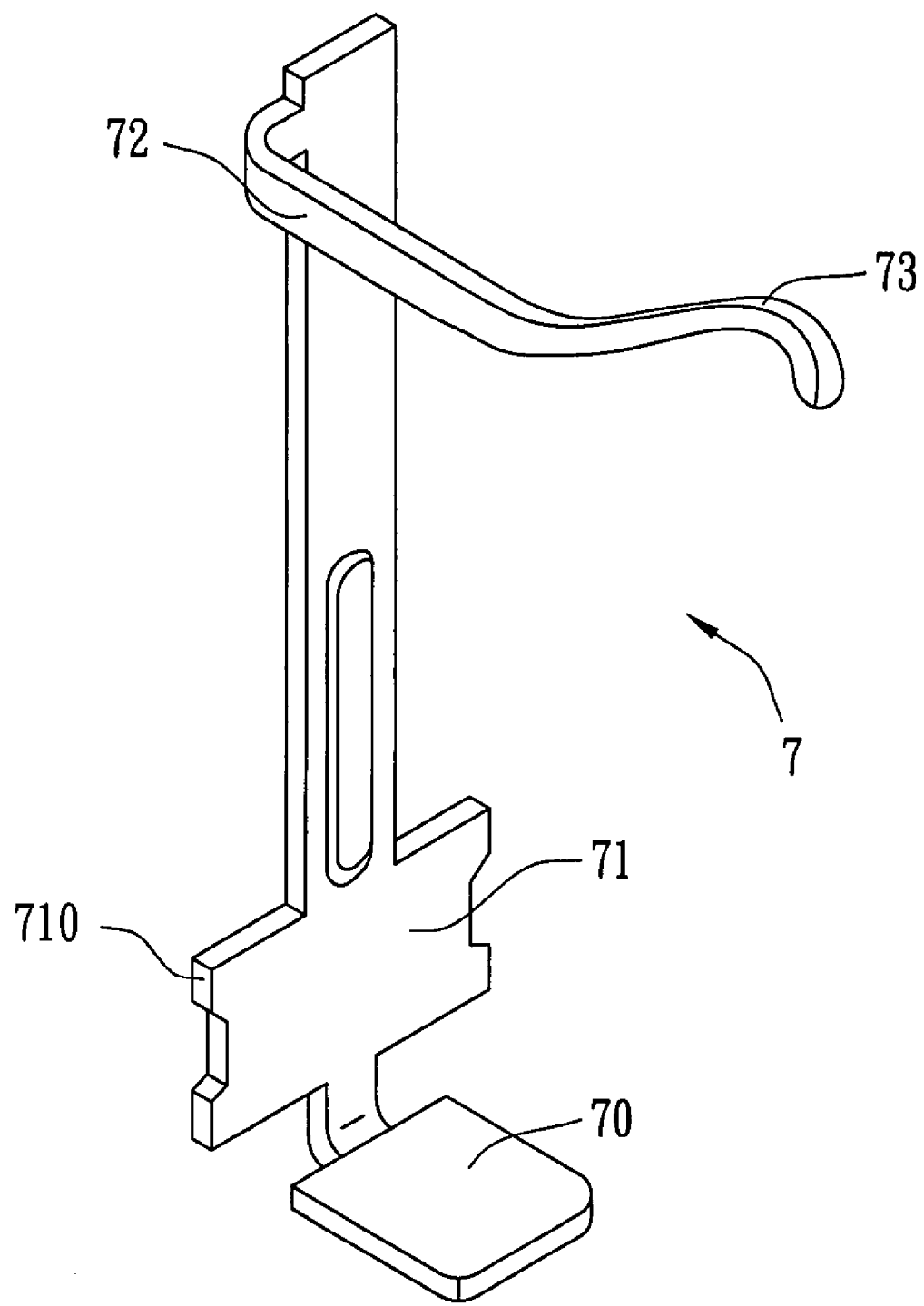
FIG. 1 is a stereogram of a conductive terminal of a conventional socket connector.

While this invention may be susceptible to embodiment in different forms, there is shown in the drawings and will be described herein in detail, a specific embodiment with the understanding that the present disclosure is to be considered an exemplification of the principles of the invention, and is not intended to limit the invention to that as illustrated.

Figure 2:
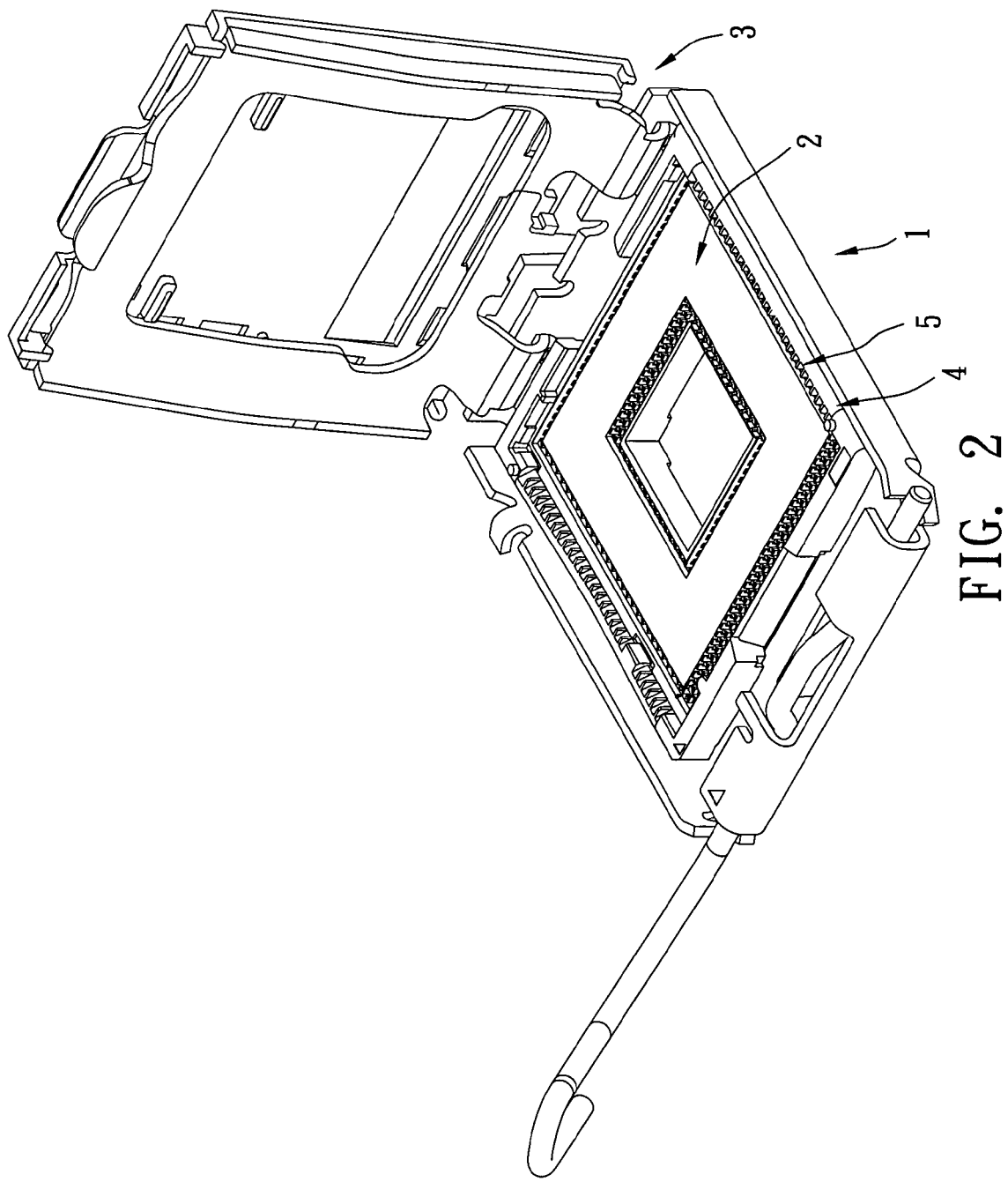
FIG. 2 is a stereogram of a socket connector in accordance with an embodiment of the present invention.

As shown in FIG. 2, the present invention provides a socket connector 1 for the insertion of a CPU device. The socket connector 1 comprises an insulation body 2, shield housing 3 and a plurality of conductive terminals 4. A plurality of terminal receptacle grooves is provided on the insulation body 2. Each of the conductive terminals 4 is received in the corresponding terminal receptacle grooves 5, and can tightly contact the CPU device (not shown) in order to have an electrical connection between them.

Figure 3:
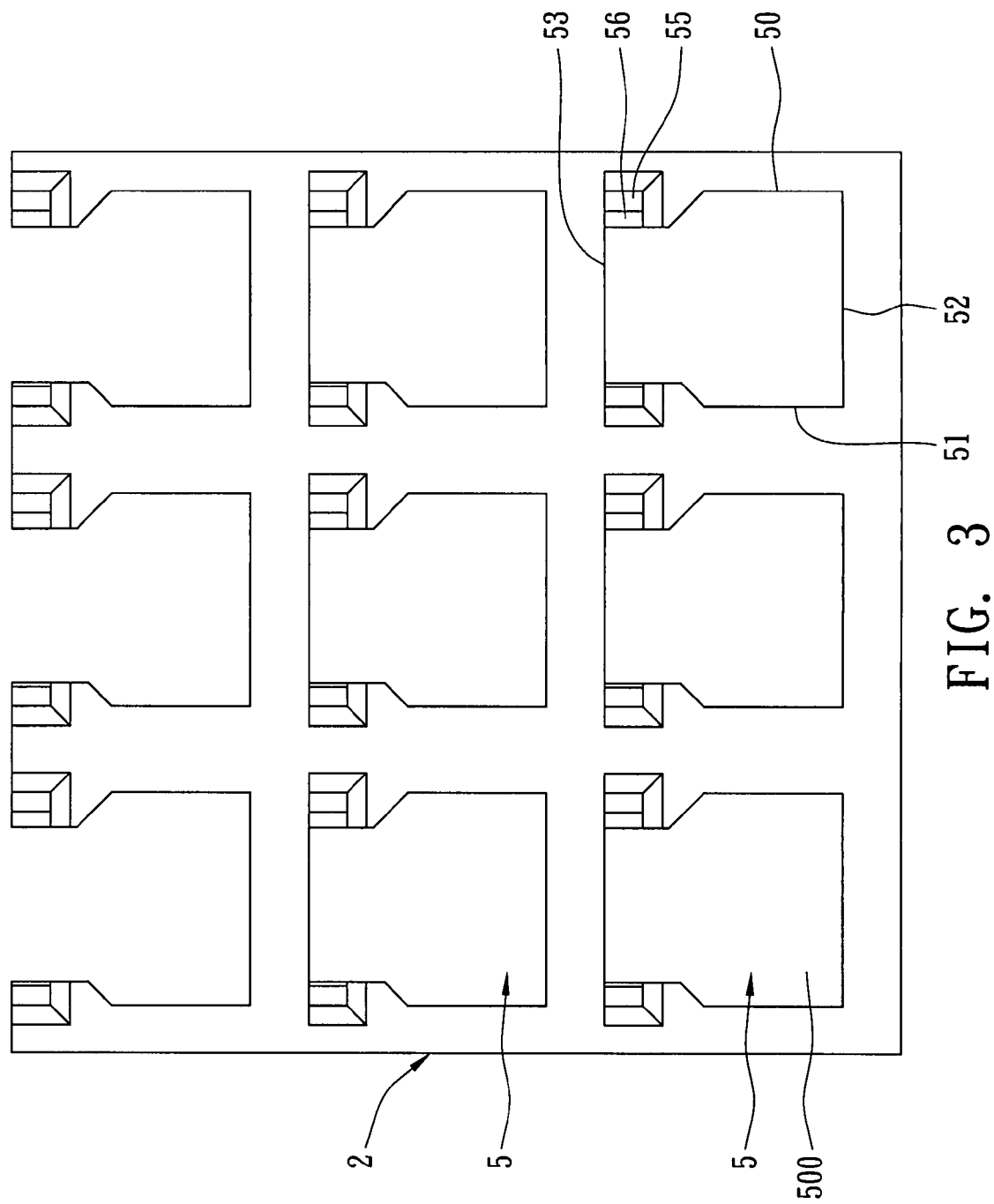
FIG. 3 is a top view of a part of an insulation body of a socket connector in accordance with the present invention.
Figure 4:
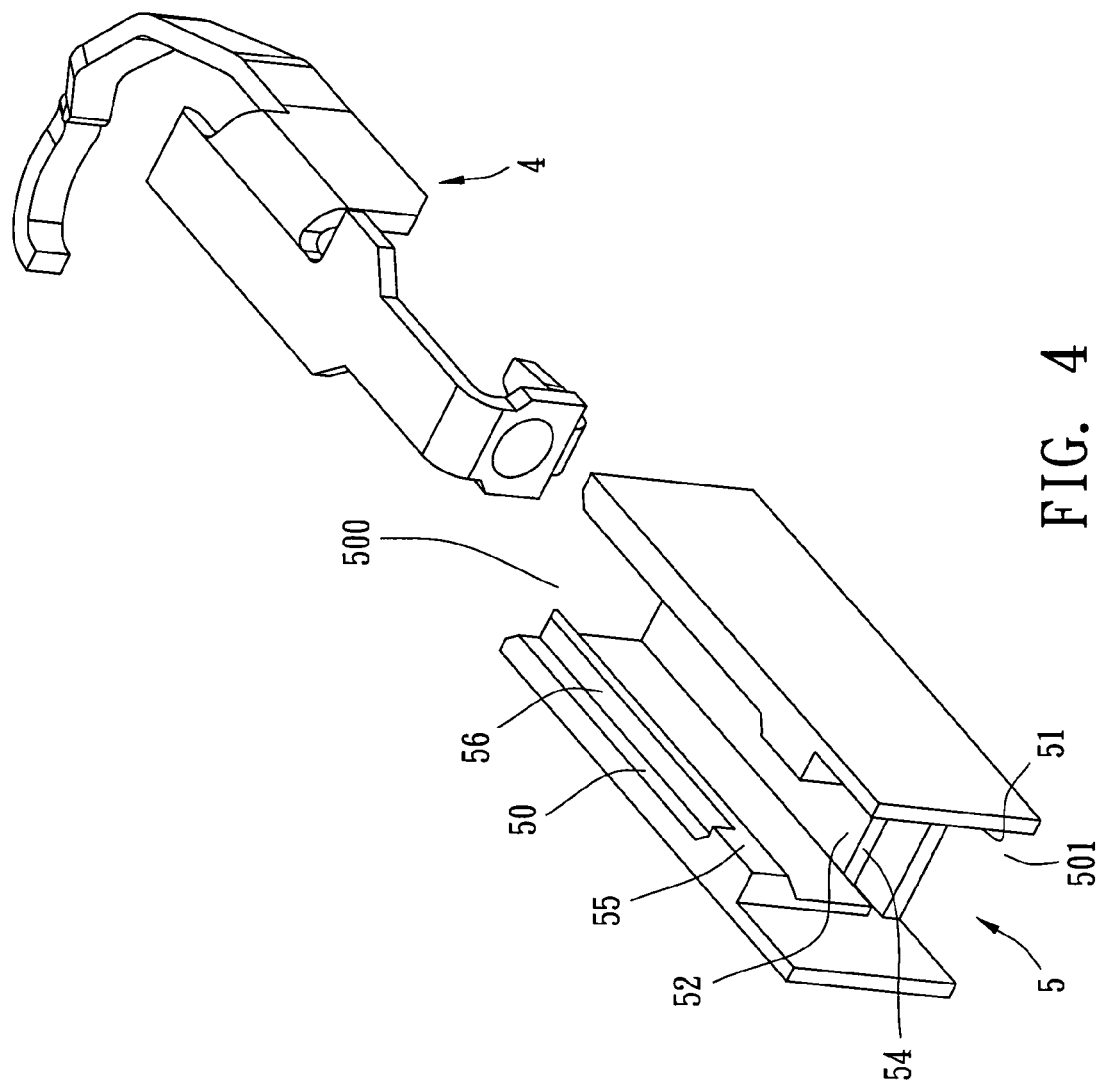
FIG. 4 is a stereogram of a conductive terminal and a terminal receptacle groove of a socket connector from which a fourth sidewall is removed in accordance with the present invention.

As shown in FIGS. 3 and 4, the side of the insulation body 2 facing the circuit board is designated as a bottom. The terminal receptacle groove 5 has rectangular-shaped openings 500 and 501 passing from the top to the bottom and a third sidewall 52 and a fourth sidewall 53 opposite each other. Each of a third sidewall 52 and a fourth sidewall 53 connects to the first sidewall 50 and the second sidewall 51. A stair-shaped first limit portion 54 is formed on the third sidewall 52. A set including a second limit portion 55 and a retaining groove 56 is located between the first sidewall 50 and the fourth sidewall 53, and the other set is located between the second sidewall 51 and the fourth sidewall 53. In this embodiment, the second limit portion 55 is the bottom of each of the retaining grooves 56.

Figure 5:
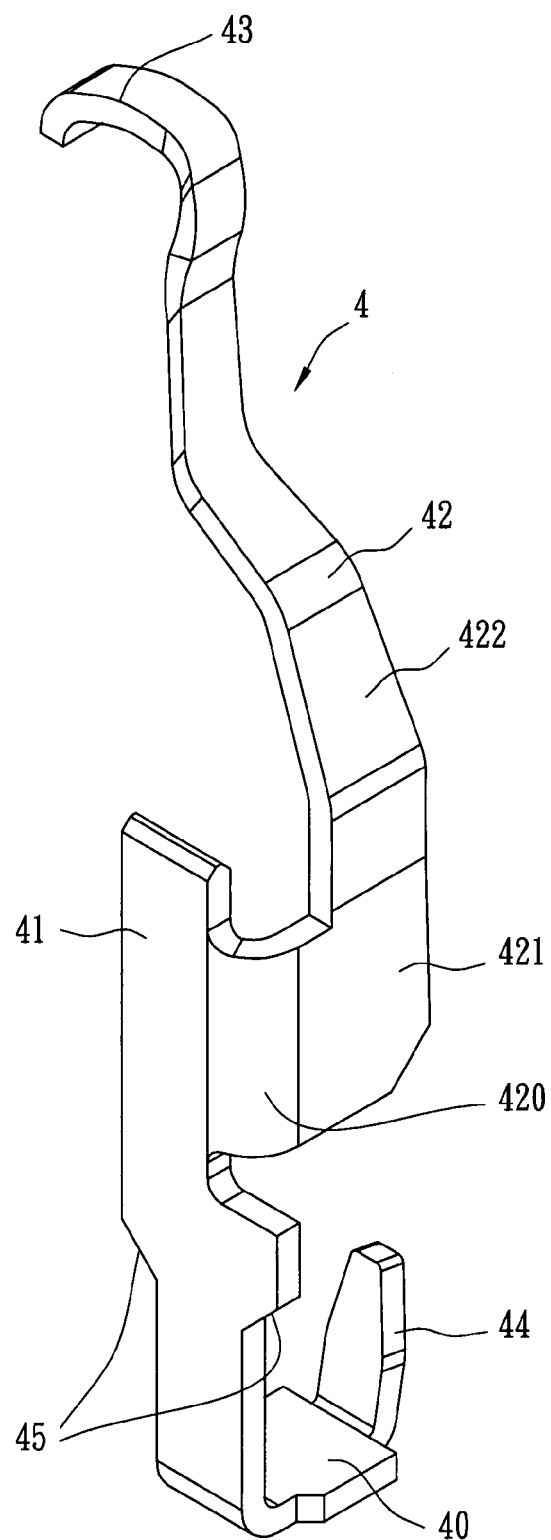
FIG. 5 is a stereogram of the conductive terminal in FIG. 4.

As shown in FIG. 5, each of the conductive terminals 4 comprises a soldering portion 40, a base portion 41 connected to a side of the soldering portion 40, an elastic arm 42 connected to another side of the base portion 41 and a contact portion 43 extending from the elastic arm 42. In detail, the conductive terminal 4 utilizes the soldering portion 40 to connect to the circuit board. The soldering portion 40 extends from the base portion 41 and has a 90-degree turn, and a first wedge portion 44 is connected to an edge of the soldering portion 40 opposite the base portion 41. The first wedge portion 44 extends upwards and outwards from the soldering portion 40, that is, an obtuse angle exists between them. The base portion 41 has an irregular shape, and the second wedge portions 45 oppositely extend from the middle of the base portion 41. The elastic arm 42 comprises a rear arm 420 horizontally bent and extending from an edge of the base portion 41, an elbow portion 421 turns around 90 degrees along the plane of the rear arm 420 and a front arm 422 obliquely and upwardly extends from the elbow portion 421. The contact portion 43 extends from the front arm 422.

Figure 6A:
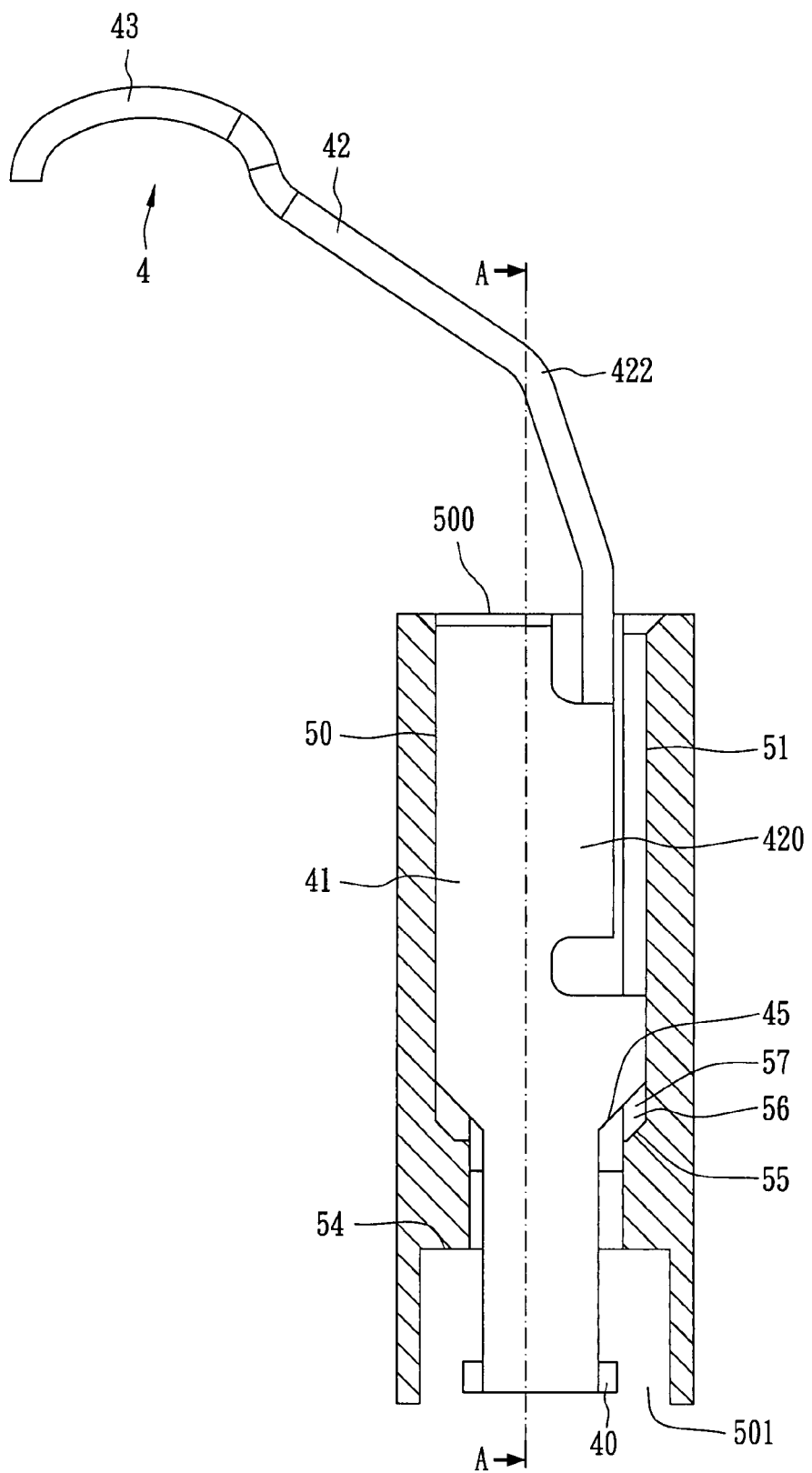
FIG. 6(a) is a cross-sectional view of the conductive terminal in FIG. 4 received in a terminal receptacle groove.
Figure 6B:
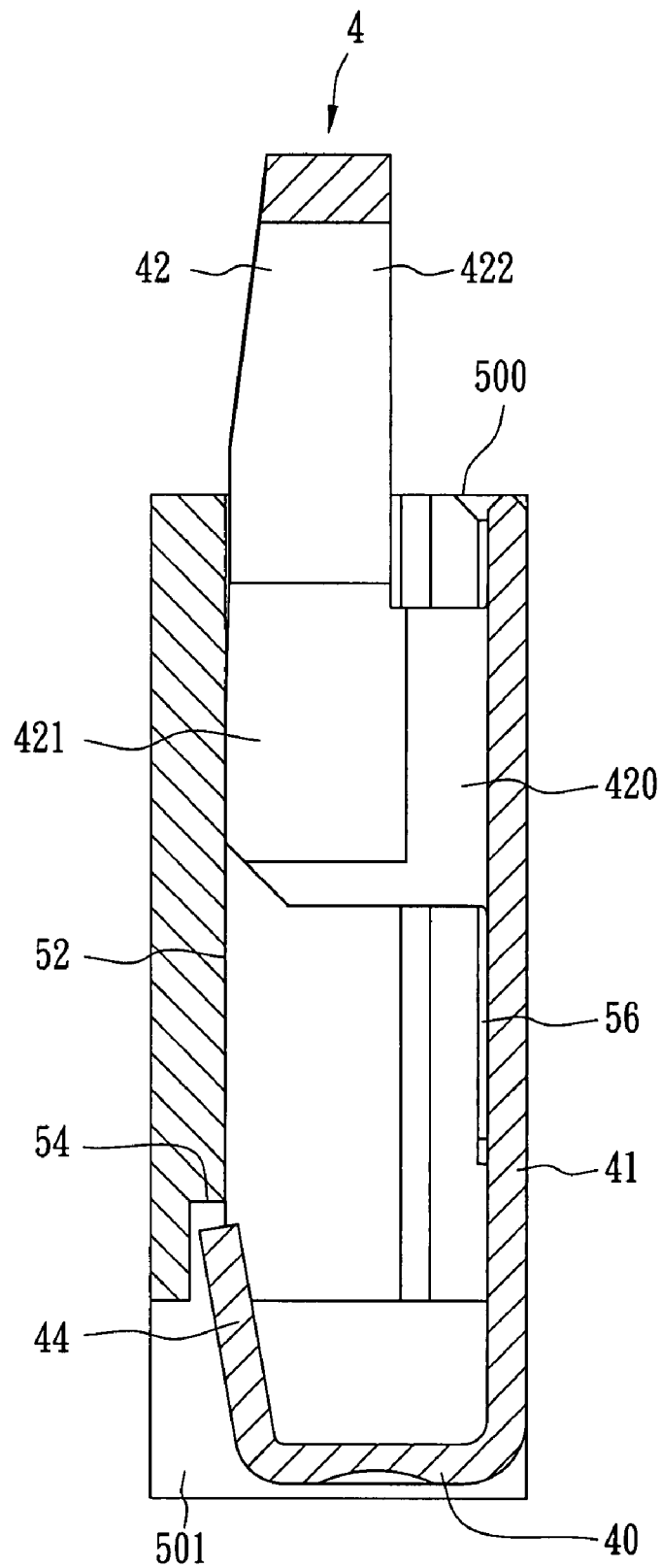
FIG. 6(b) is a cross-sectional view taken along line A-A in FIG. 6(a)
Figure 7:
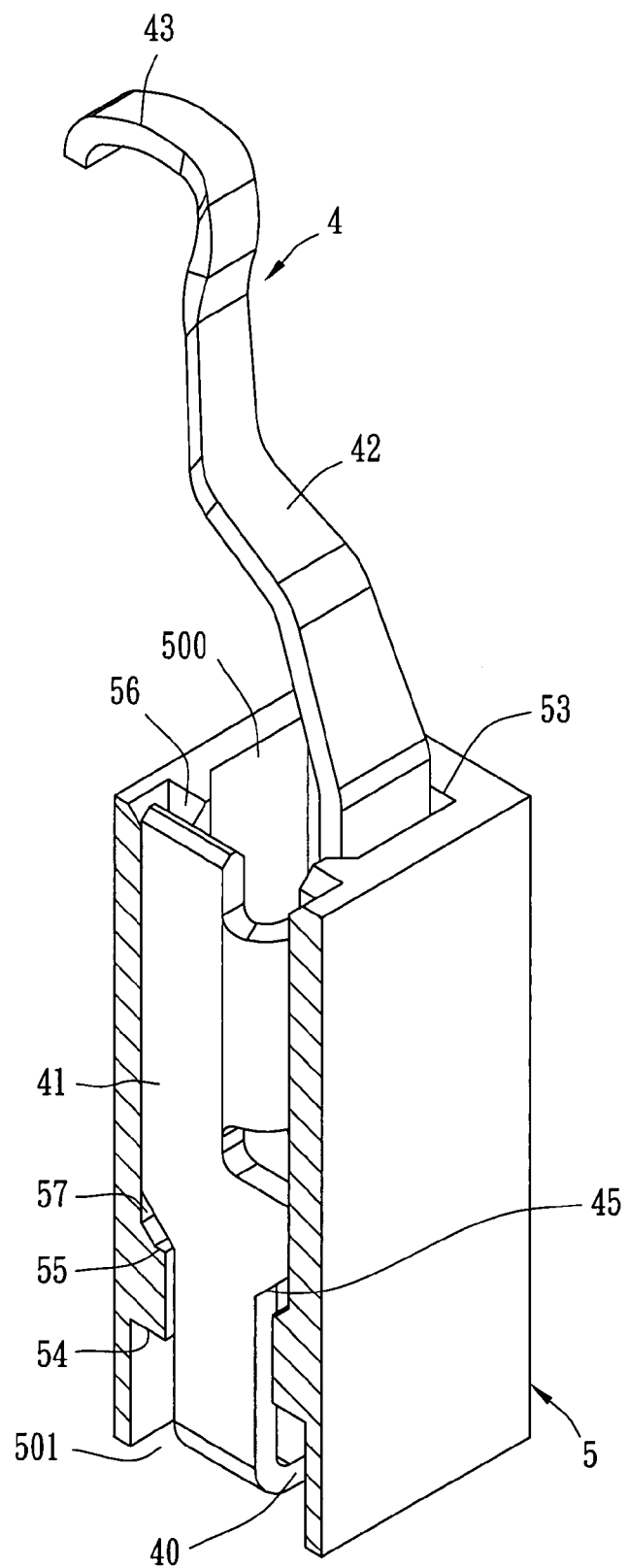
FIG. 7 is a cross-sectional view of the conductive terminal in FIG. 4 received in a terminal receptacle groove.

Further referring to FIGS. 6(a), 6(b) and 7, each of the conductive terminals 4 is inserted into one of the terminal receptacle grooves 5 from the upper opening 500 by leaning the base portion 41 on the fourth sidewall 53 (facing the second sidewall 52) of the terminal receptacle groove 5. The soldering portion 40 is received in the lower opening 501. The elastic arm 42 and the contact portion 43 extend out of the upper opening 500 of the terminal receptacle groove 5. The first wedge portion 44 passes through the first limit portion 54 and stops under it when the conductive terminal 4 is inserted into the terminal receptacle groove 5. Two edges of the base portion 41 are received in two retaining grooves 56. The second wedge portion 45 is received above the second limit portion 55. In this embodiment, a chamfer is formed on the lower edge of the second wedge portion 45 and adjacent to the second limit portion 55 so that collision does not occur during insertion. Therefore, the first limit portion 54 and the second limit portion 55 respectively prevent the first wedge portion 44 and the second wedge portion 45 from upward and downward movement. Consequently, the terminal 4 is quite stably retained in the terminal receptacle groove 5 and cannot be pulled out. In addition, the socket connector 1 needs to be mounted on the circuit board when tested or used. The soldering balls apply downward pull force on the socket connector 1. Because the a gap previously exists between the first limit portion 55 and the second limit portion 45, the second limit portion 45 can move downwards. Consequently, no reacting force results from the first limit portion 55 and weak soldering does not occur between the terminal 4 and the circuit board, and the working life of the socket connector 1 is ensured.

As to the socket connector 1 of the present invention, the design of the shape of the terminal 4 and the structure of the terminal receptacle groove 5 mated with the terminal 4 can be modified according to practical applications. In another embodiment, another conductive terminal 4' mated with the terminal receptacle groove 5 is provided.

Figure 8:
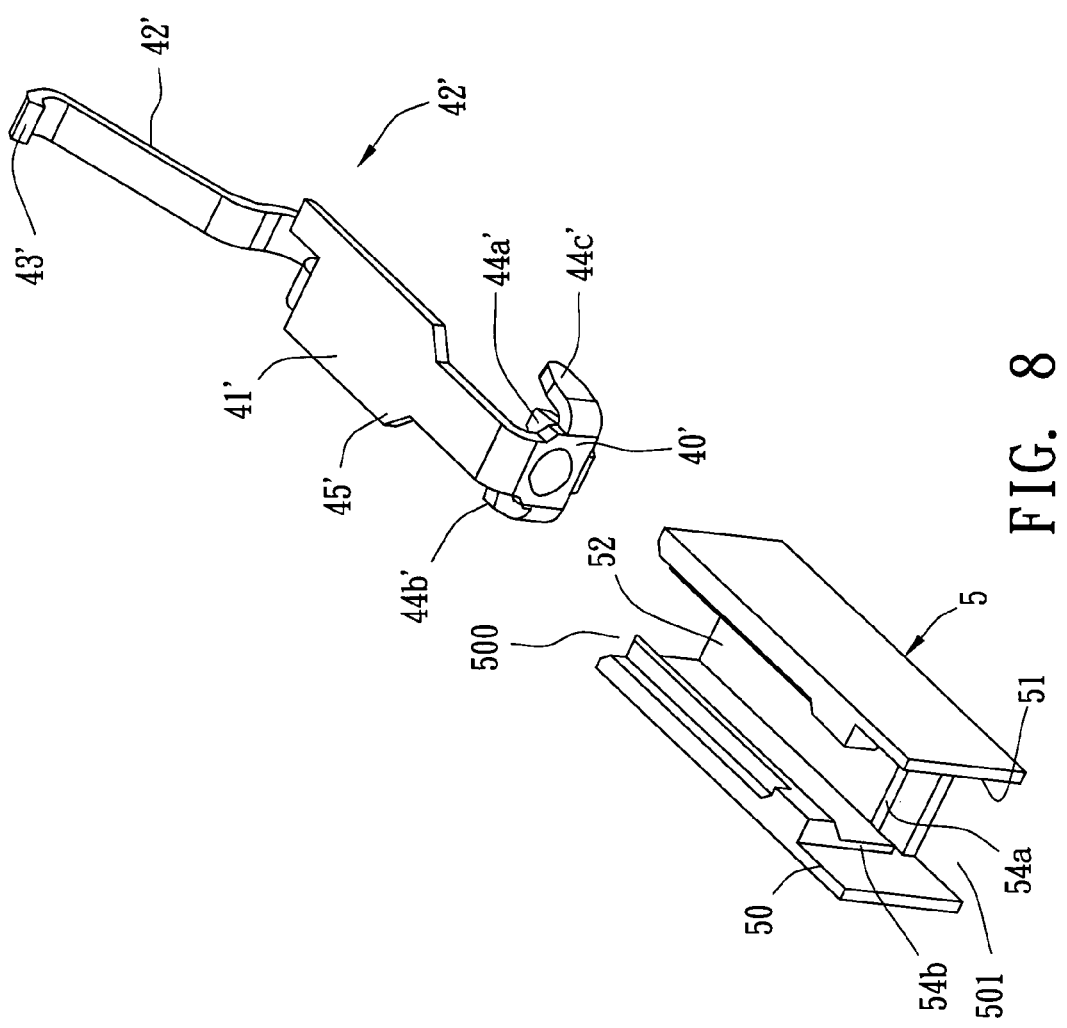
FIG. 8 is a stereogram of a conductive terminal and a terminal receptacle groove of a socket connector from which a fourth sidewall is removed in accordance with another embodiment of the present invention.
Figure 9:
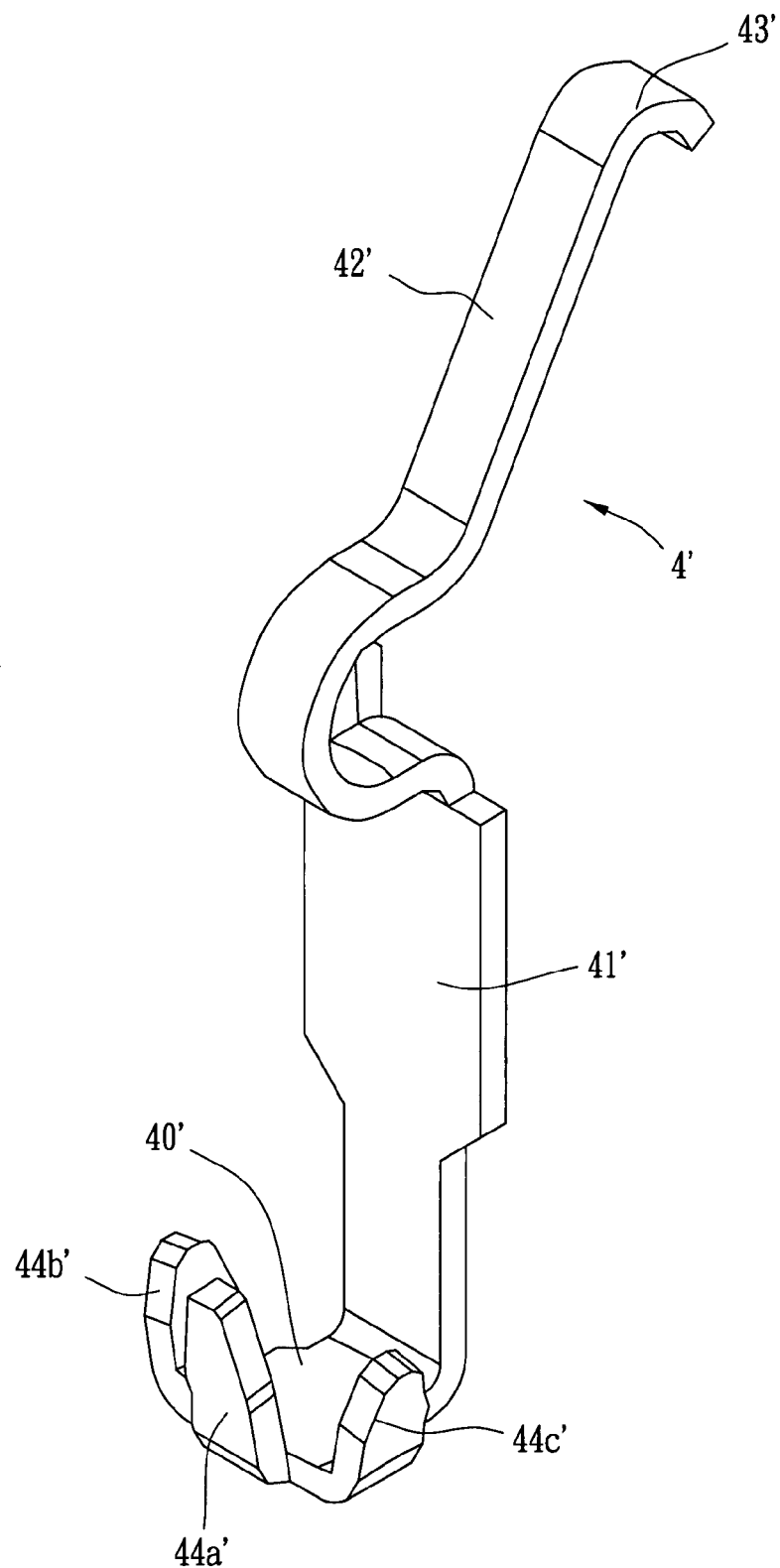
FIG. 9 is a stereogram of the conductive terminal in FIG. 8.
Figure 10:
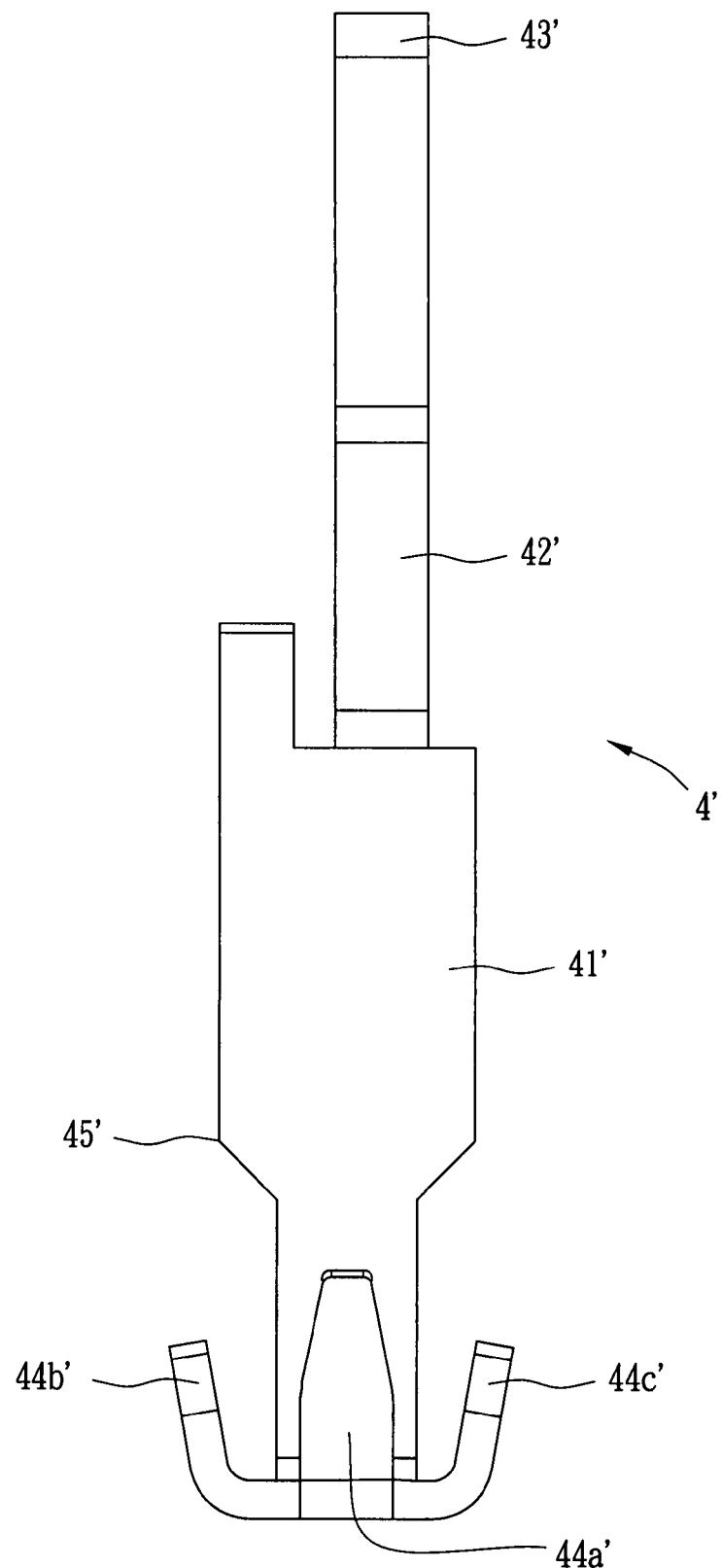
FIG. 10 is a side view of the conductive terminal in FIG. 8.

As shown in FIGS. 8, 9 and 10, the conductive terminal 4' comprises a soldering portion 40', a base portion 41' perpendicularly bent and extending from the soldering portion 40', an elastic arm 42 bent upwards and extending from another side of the base portion 41' and a contact portion 43' extending from the edge of the elastic arm 42'. In detail, there are first wedge portions 44a', 44b' and 44c' bent upwards and extending from the edge of the soldering portion 40' opposite the base portion 41' and the other edges of the soldering portion 40'. Accordingly, first limit portions 54a, 54b and 54c (see FIG. 11) are respectively provided on a third sidewall 52, a first sidewall 50 and a second sidewall 51, and are dividedly mated with the first wedge portions 44a', 44b' and 44c'. Second wedge portions 45' oppositely extend from the middle of the base portion 41', and similarly, their lower edges have chamfers. The front portion of the elastic arm 42' extends from the base portion 41' along the extension direction of the soldering portion 40', and the rear portion of the elastic arm 42' is bent toward the direction opposite the extension direction of the front portion and then obliquely and upwardly extended.

Figure 11:
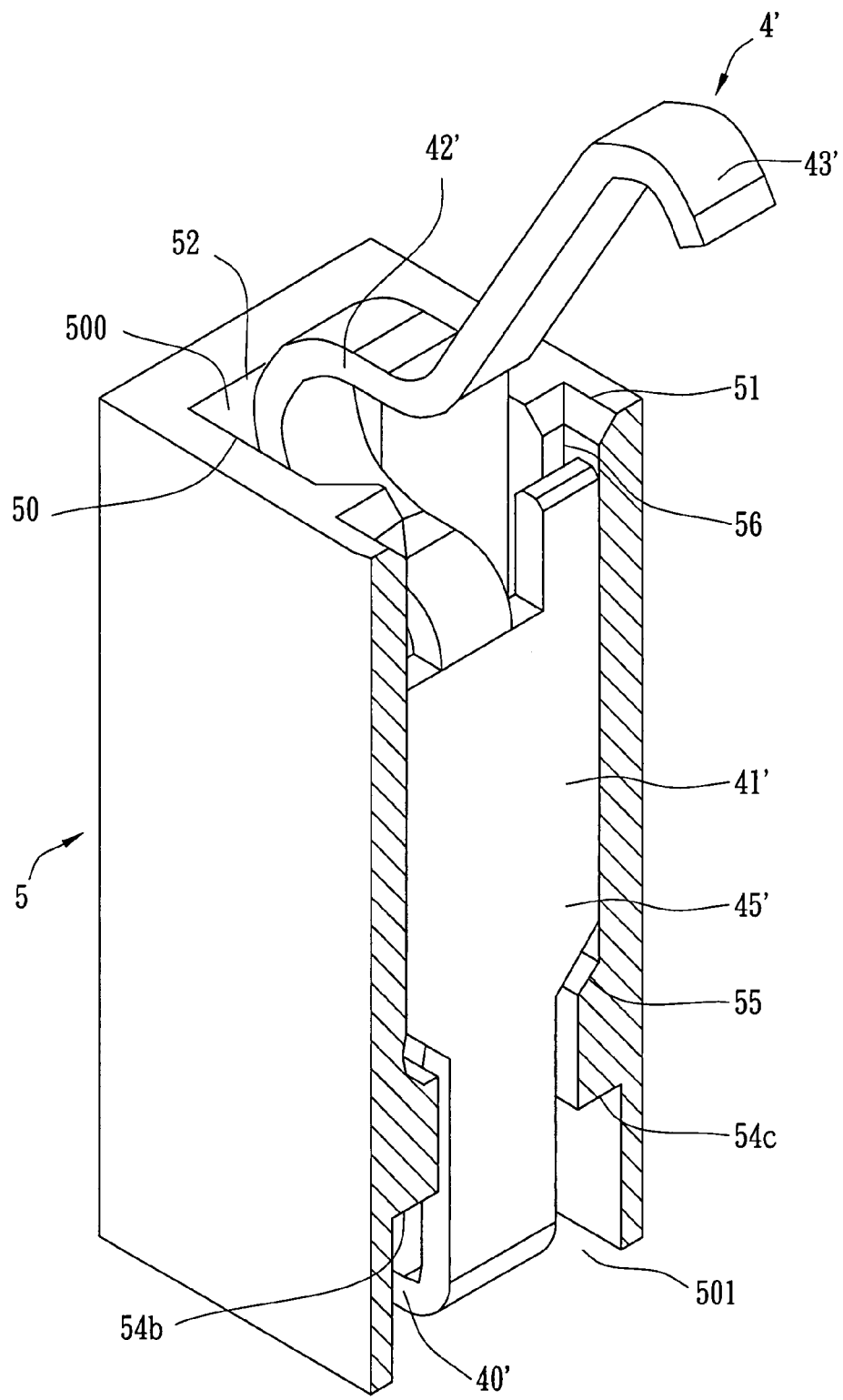
FIG. 11 is a cross-sectional view of the conductive terminal in FIG. 8 received in a terminal receptacle groove.
Figure 12A:
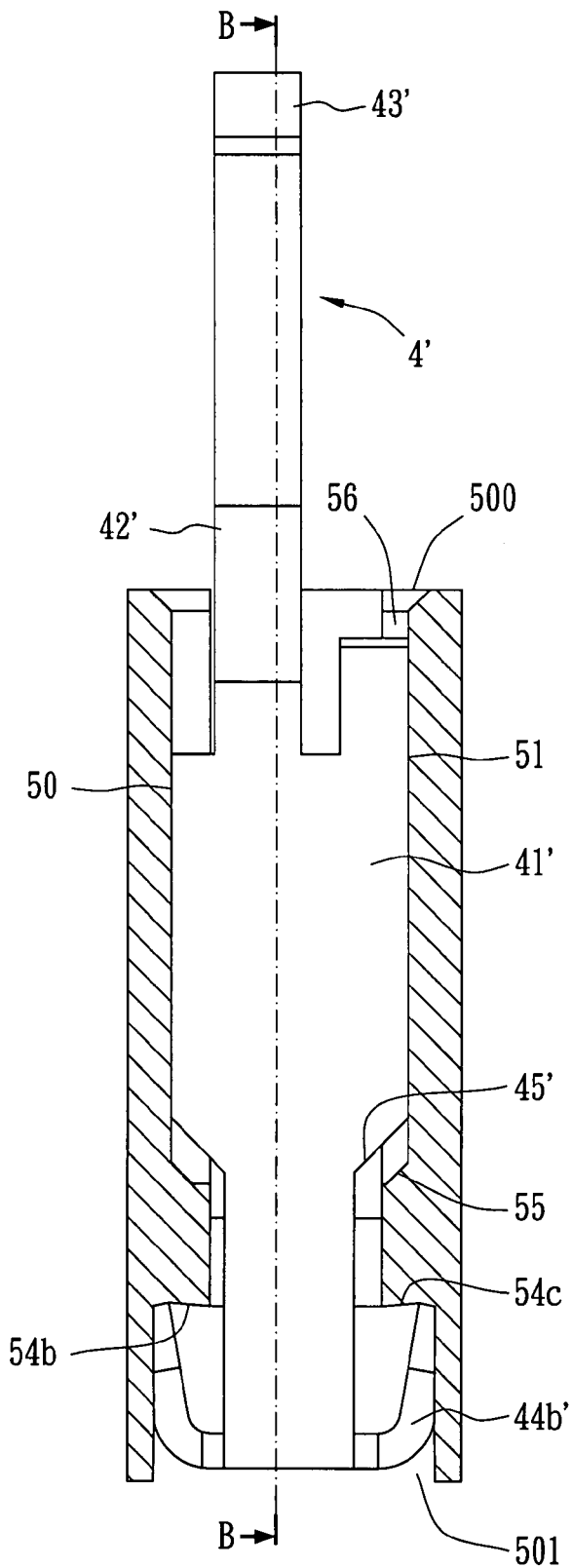
FIG. 12(a) is another cross-sectional view of the conductive terminal in FIG. 8 received in a terminal receptacle groove.
Figure 12B:
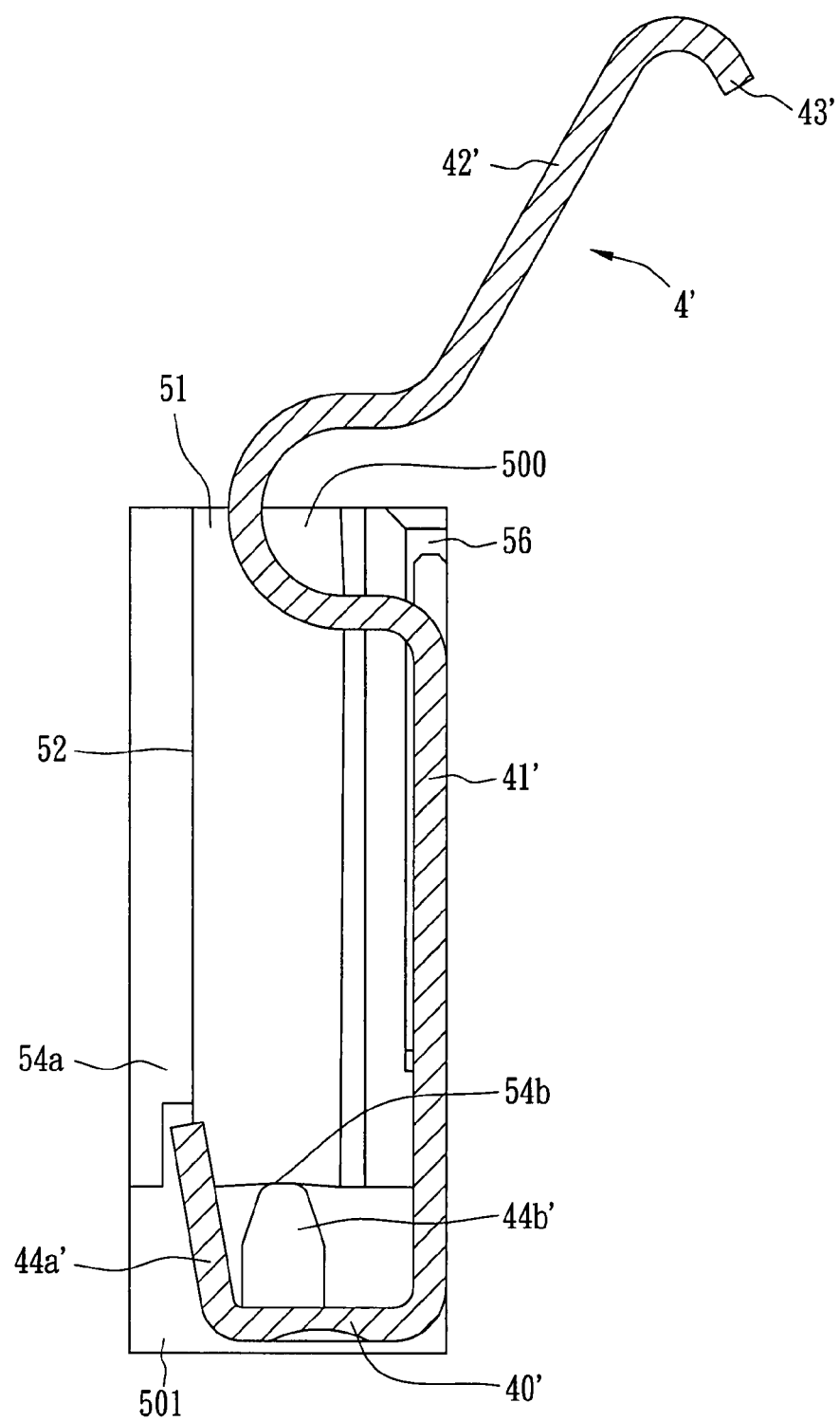
FIG. 12(b) is a cross-sectional view taken along line B-B in FIG. 12(a).

Further referring to FIGS. 11, 12(a) and 12(b), the soldering portion 40' of the conductive terminal 4' is received in the lower opening 501. The elastic arm 42' and the contact portion 43' extend out of the upper opening 500. Each of the first wedge portions 44a', 44b' and 44c' is respectively received under each of the first limit portions 54a, 54b and 54c so that it cannot move upwards. The terminal 4 is prevented from escaping from the upper opening 500. The two edges of the base portion 41' are received in corresponding retaining grooves 56. The second wedge portion 45' is received above the second limit portion 55 and the downward movement is limited so that the terminal 4 is prevented from escaping from the lower opening 501.

Because the conductive terminal has the first wedge portion received under the first limit portion provided on an inner wall of the terminal receptacle groove 5 and a second wedge portion received above the second limit portion, the terminals of the socket connector are prevented from escaping upwards and downwards from the terminal receptacle groove 5. Compared with the conventional terminals with protrusions or bumps destructively interfering and mating with the terminal receptacle groove, the socket connector of the present invention prevent the insulation body from stress concentration caused by the destruction and interference fitting. Consequently, the soldering quality of the socket connector and the circuit board is improved. It not only upgrades the stability of electrical connection and the performance, but the working life is also prolonged.

While a preferred embodiment of the invention is shown and described, it is envisioned that those skilled in the art may devise various modifications without departing from the spirit and scope of the foregoing description and the appended claims.

What is claimed is:

1. A socket connector comprising:
   an insulation body and a plurality of terminal receptacle grooves going through the insulation body from its upper surface to its lower surface, each of the terminal receptacle grooves including a first limit portion and a second limit portion; and
   a plurality of conductive terminals, each of the conductive terminals received in the corresponding terminal receptacle groove and comprising a base portion with a first and second side and a soldering portion connected to the first side of the base portion, an elastic arm connected to the second side of the base portion and a contact portion connected to the elastic arm, each of the conductive terminals further comprising at least a first wedge portion and a second wedge portion, the second wedge portion extending from the base portion and positioned between the contact portion and the solder portion, the first limit portion being positioned above the first wedge portion and limiting the first wedge portion from moving upwards, and the second limit portion being positioned under the second wedge portion and limiting the second wedge portion from moving downwards.

2. The socket connector of claim 1, wherein the soldering portion extends from an edge of the base portion and has an orientation that is 90 degrees different than an orientation of the base portion 90-degree turn.

3. The socket connector of claim 2, wherein the soldering portion couples the first wedge portion and the base portion and an obtuse angle exists between the first wedge portion and the soldering portion.

4. The socket connector of claims 2, wherein the first wedge portion extends and bends from a first edge of the soldering portion, the first edge opposite a second edge of the solder portion, the second edge coupling the soldering portion to the base portion.

5. The socket connector of claim 1, wherein the plurality of conductive terminals further comprise a chamfer located at a lower edge of the second wedge portion.

6. The socket connector of claim 1, further comprising a gap existing between the second wedge portion and the second limit portion.

7. The socket connector of claim 1, wherein the first limit portion is provided on a limit stair of a sidewall of the terminal receptacle groove.

8. The socket connector of claim 1, wherein each of the terminal receptacle grooves has a first sidewall and a second sidewall opposite each other, and further comprises a third sidewall and a fourth sidewall; each of the third sidewall and the fourth sidewall connected to the first sidewall and the second sidewall, and the first limit portion is formed in the third sidewall, and the second limit portion is positioned along the connection between the fourth sidewall and the first sidewall.

9. The socket connector of claim 8, wherein the first limit portion extends from the first sidewall and the second sidewall.

10. The socket connector of claim 8, wherein each of the terminal receptacle grooves has retaining grooves respectively disposed between the first sidewall and the fourth sidewall and between the second sidewall and the fourth sidewall, and the second limit portions are bottoms of the retaining grooves.

11. The socket connector of claim 10, wherein the base portion of each conductive terminal has two edges received in the corresponding retaining grooves.

12. A socket connector comprising:
    an insulation body with an upper surface and a lower surface, the insulation body including a plurality of terminal receptacle grooves extending through the insulation body from the upper surface to the lower surface, each of the plurality of terminal receptacle grooves including a first limit portion and a second limit portion; and
    a plurality of conductive terminals, each of the conductive terminals positioned in the corresponding terminal receptacle groove and comprising a base portion, a soldering portion connected to a first side of the base portion, an elastic arm connected to a second side of the base portion and a contact portion connected to the elastic arm, each of the conductive terminals further comprising at least a first wedge portion and a second wedge portion, the second wedge positioned between the contact portion and the soldering portion, wherein the first limit portion is positioned between the first wedge portion and the upper surface, and the second limit portion is positioned between the second wedge portion and the lower surface, wherein, in operation, the plurality of conductive terminals are inserted into the terminal receptacle groves at the upper surface and moved toward the lower surface until the first wedge portion slides past the first limit portion and translates into a blocking position that prevents movement of the conductive terminals toward the upper surface, and wherein the second limit portion prevents sufficient insertion of the conductive terminal into the terminal receptacle groove from the lower surface.

13. The socket connector of claim 12, wherein the first wedge portion comprises a plurality of first wedge portions, each of the plurality of first wedge portions extending from the soldering portion at a different angle, wherein the angle between two of the plurality of first wedge portions is at least 90 degrees.

14. The socket connector of claim 13, wherein the plurality of first wedge portions consists of three wedge portions, each of the three wedge portions extending in a first direction that is about 90 degrees apart from a second direction of an adjacent other of the first wedge portion.

15. The socket connector of claim 12, wherein the first wedge extends from the soldering portion in a cantilevered angled manner and the second wedge is on the base portion and the first wedge and the base are separate and are coupled together by the soldering portion.

16. The socket of claim 15, wherein the first wedge and the base are coupled to opposing edges of the soldering portion.

17. A socket connector comprising:
   an insulation body and a plurality of terminal receptacle grooves extending through the insulation body from its upper surface to its lower surface, each of the terminal receptacle grooves including a first limit portion and a second limit portion; and
   a plurality of conductive terminals, each of the conductive terminals received in the corresponding terminal receptacle groove and comprising a base portion, an elastic arm, a soldering portion and a first and second wedge portion, the base portion including a first and second side, wherein the soldering portion is connected to the first side of the base portion and the elastic arm is connected to the second-side of the base portion and a contact portion is connected to the elastic arm, the first wedge portion extending from an edge of the soldering portion toward the upper surface and a second wedge portion extending from the base portion and positioned between the contact portion and the solder portion, the first limit portion being configured to engage the first wedge portion and limit the first wedge portion from moving upwards, and the second limit portion being configured to engage the second wedge portion and limit the second wedge portion from moving downwards.

* * * * *